(12) United States Patent
Chen et al.

(10) Patent No.: US 7,170,147 B2
(45) Date of Patent: Jan. 30, 2007

(54) DISSIPATIVE ISOLATION FRAMES FOR ACTIVE MICROELECTRONIC DEVICES, AND METHODS OF MAKING SUCH DISSIPATIVE ISOLATION FRAMES

(75) Inventors: Young-Kai Chen, Berkeley Heights, NJ (US); Vincent Etienne Houtsma, Berkeley Heights, NJ (US); Nils Guenter Weimann, Chatham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/628,748

(22) Filed: Jul. 28, 2003

(65) Prior Publication Data

US 2005/0023708 A1    Feb. 3, 2005

(51) Int. Cl.
*H00L 23/552* (2006.01)
*G00R 21/26* (2006.01)
*H00B 11/02* (2006.01)

(52) U.S. Cl. ............... 257/659; 257/660; 257/E23.114; 257/E23.115; 438/18; 438/953; 438/FOR. 142; 438/516; 174/34 R; 174/34 C

(58) Field of Classification Search ................ 257/659, 257/660, E23.114, E23.115; 438/18, 953, 438/FOR. 142, FOR. 449, 516; 174/34 R, 174/34 C See application file for complete search history.

(56) References Cited

U.S. PATENT DOCUMENTS

| | | | |
|---|---|---|---|
| 4,911,101 A | 3/1990 | Ballingall, III et al. | |
| 5,028,556 A * | 7/1991 | Chang | ......................... 438/218 |
| 5,186,750 A | 2/1993 | Sugiura et al. | |
| 5,220,192 A * | 6/1993 | Owens et al. | ............... 257/519 |
| 5,294,565 A | 3/1994 | Shiraishi | |
| 5,673,172 A * | 9/1997 | Hastings et al. | ............ 361/685 |
| 5,681,769 A * | 10/1997 | Lien | ........................... 438/297 |
| 5,807,771 A * | 9/1998 | Vu et al. | ..................... 438/154 |
| 5,825,042 A * | 10/1998 | Strobel et al. | ........... 250/515.1 |
| 6,180,432 B1 * | 1/2001 | Freeouf | ....................... 438/93 |
| 6,511,893 B1 * | 1/2003 | Woodruff et al. | ........... 438/449 |

FOREIGN PATENT DOCUMENTS

EP    273702    * 12/1997
JP    1-183137  * 7/1989

\* cited by examiner

*Primary Examiner*—Long Pham
*Assistant Examiner*—Shrinivas H. Rao

(57) ABSTRACT

Microelectronic apparatus having protection against high frequency crosstalk radiation, comprising: a planar insulating substrate; an active semiconductor electronic device located over a first region of the insulating substrate; and a doped semiconductor located in a second region of the insulating substrate substantially surrounding the first region. Apparatus further comprising a dissipative conductor overlaying and adjacent to the doped semiconductor. Apparatus additionally comprising metallic test probe contacts making electrical connections with the active semiconductor electronic device. Application of the apparatus to dissipate crosstalk radiation having a center frequency within a range between about 1 gigahertz and about 1,000 gigahertz. Methods for making the apparatus.

17 Claims, 9 Drawing Sheets

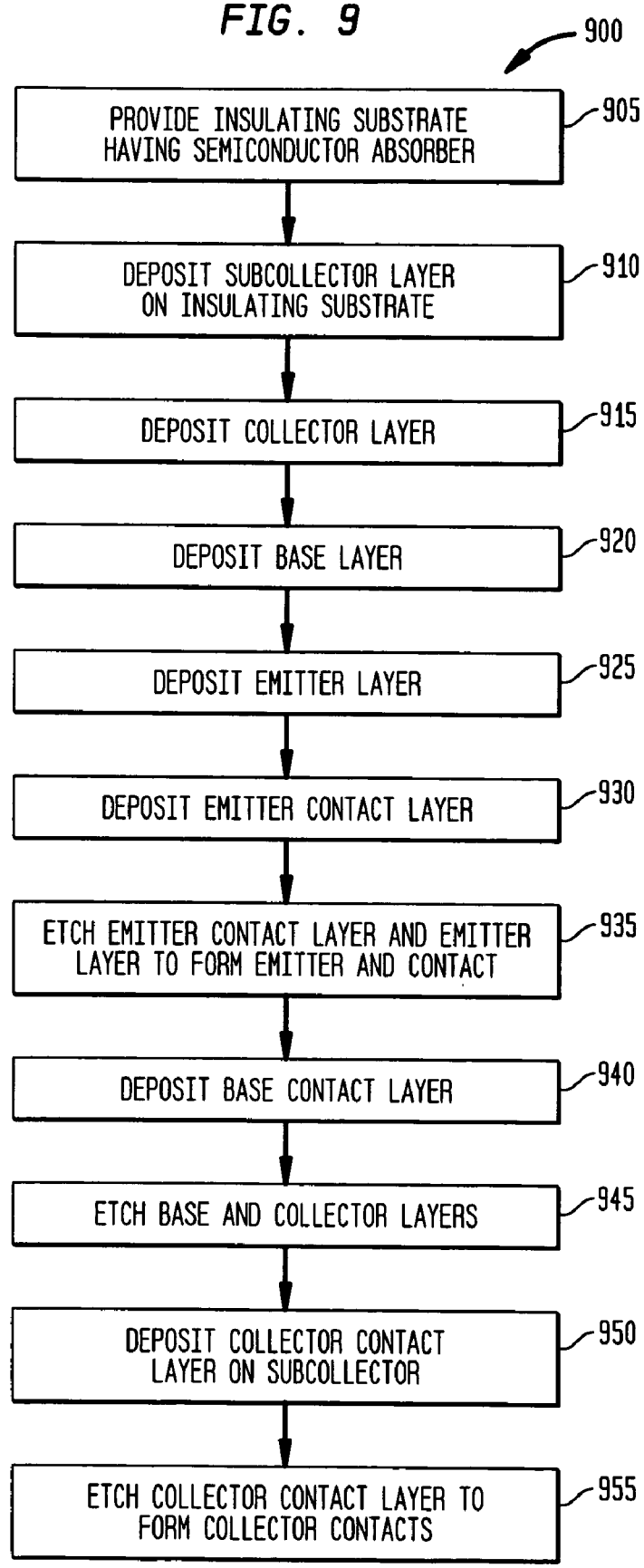

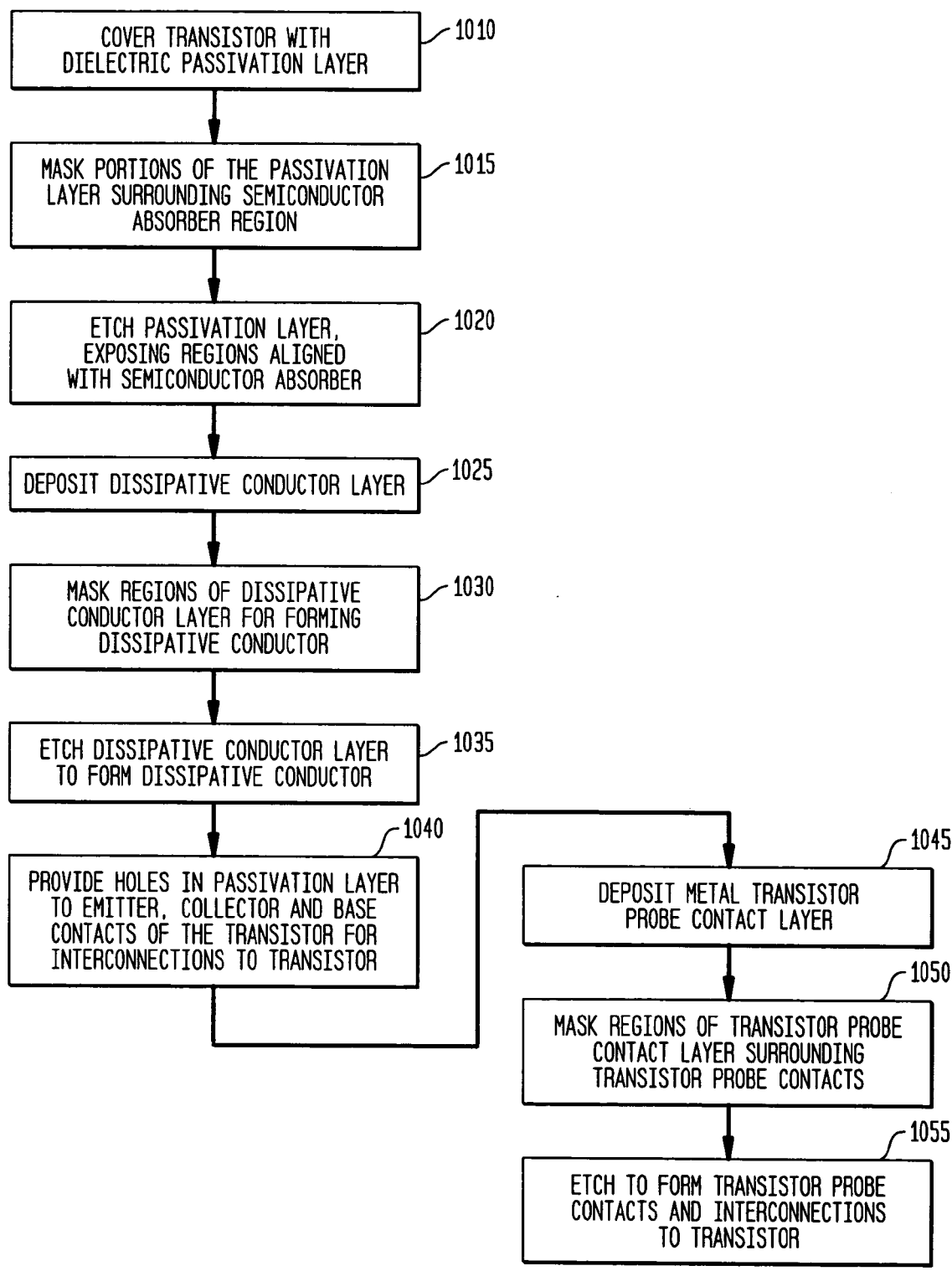

DISSIPATIVE ISOLATION FRAMES FOR ACTIVE MICROELECTRONIC DEVICES, AND METHODS OF MAKING SUCH DISSIPATIVE ISOLATION FRAMES

The U.S. Government has a paid-up license in this invention and the right in limited circumstances to require the patent owner to license others on reasonable terms as provided for by the terms of Defense Advanced Research Projects Agency (DARPA) contract No. MDA972-03-C-0027.

FIELD OF THE INVENTION

The present invention relates to the field of active microelectronic devices formed in multilayer semiconductor structures carried on insulating substrates.

BACKGROUND OF THE INVENTION

Multilayer semiconductor devices formed on insulating substrates are the foundation for fabrication of integrated circuits. Through a precise series of steps, wafers holding integrated circuits comprising hundreds or millions of active components such as transistors and memory cells are produced. Active devices are those that manipulate a signal, by amplification for example. Integrated circuits also include metal trace conductors that conduct signals between the active components as well as dielectric materials separating the metal traces from one another. The never ending drive for higher bandwidth, processing speeds, greater computing power and memory, and other performance improvements, fuels the need for ongoing design and fabrication of integrated circuits having ever increasing complexity.

The cutoff frequency or speed of microelectronic devices incorporated into integrated circuits is defined in cycles per second, or Hertz (Hz). Cutoff frequency is one of the fundamental parameters in which benchmarks regarding performance improvements are expressed. High frequency systems have in recent years been provided having speeds in excess of one gigahertz (Ghz), meaning that the system can manipulate signals having a commensurate frequency. As the relentless drive for higher system speeds persists, systems operating at 10 Ghz, 100 Ghz or even 1000 Ghz are on the horizon.

In order to function at a given computing speed, a high speed integrated circuit generally must carry a signal that is modulated at a commensurate frequency. Hence, signals carried by a 10 Ghz high speed integrated circuit can be expected to be modulated at such a frequency. As integrated circuit speeds breached 1 Ghz, these signals accordingly entered the frequency range of microwaves, that is, 1–40 Ghz. As integrated circuit speeds continue to escalate, signals will be modulated as millimeter or submillimeter waves. Millimeter waves have a frequency range between about 40–50 Ghz. Submillimeter waves have a frequency range between about 50–1000 Ghz.

High speed integrated circuit signals are typically carried in coplanar metal trace conductors, which may in relatively advanced systems occupy several interconnected planes overlaying each other within the integrated circuit. The coplanar metal trace conductors are located closely together in order to minimize the chip size. The transmission of integrated circuit signals in the coplanar metal trace conductors at frequencies in the range of microwaves, millimeter waves and submillimeter waves can result in secondary propagation of such signals outside of such trace conductors. If such secondarily propagated signals reach adjacent coplanar metal trace conductors, they can interfere with and corrupt other intended circuit signals.

High speed integrated circuit chips are typically made on wafers of a semi insulating substrate such as indium phosphide or gallium arsenide. These disc shaped wafers may be two to twelve inches in diameter and may hold from about a hundred to several thousand individual chips during fabrication. Wafers usually are simultaneously batch processed, in lots of 25, for example. The cumulative investment represented by a single wafer batch during production can be tremendous. Given the complexity of integrated circuits, manufacturing quality control testing is thus an important part of wafer fabrication in order to manage production losses, both during and following completion of such manufacture.

Test transistors are commonly integrated into a wafer next to integrated circuits to facilitate such manufacturing quality control testing. Such test transistors are provided with enlarged input and output contacts for direct application and detection of test signals, but are not otherwise electrically connected with the integrated circuits. Measurement probes are applied to the input and output contacts of such a test transistor. A high frequency signal is introduced into the test transistor through the input contacts, and the transistor output is collected at the output contacts for measurement. If the collected output signal conforms to the performance specifications of the test transistor, correct production of the test transistor is confirmed. Correct test transistor production then constitutes indirect verification of correct production of the integrated circuits on the same wafer.

Test transistor probe contacts must be substantially larger and longer than integrated circuit trace conductors, in order to receive application of a test probe. As the test signal propagates on the wafer surface and within the wafer subsurface, interference with other test transistors or with elements of a nearby integrated circuit can occur, distorting the test signal and invalidating the test results. In testing of integrated circuits themselves having signal frequencies in the range of microwaves, millimeter waves or submillimeter waves during and after manufacture, the same problem of signal propagation outside of the metal trace conductors can occur.

Accordingly, there is a need for high speed integrated circuits and for test transistors that are protected against signal crosstalk in the microwave, millimeter and submillimeter signal frequency ranges. There is also a need for methods of manufacturing integrated circuits and test transistors in a manner allowing provision of such crosstalk protection.

SUMMARY OF THE INVENTION

According to the present invention, microelectronic apparatus are provided that incorporate protection against high frequency crosstalk radiation. Methods for making such microelectronic apparatus are also provided. The microelectronic apparatus may, for example, comprise a semiconductor absorber interposed between two active semiconductor electronic devices. The microelectronic apparatus may further comprise a dissipative conductor located over and in electrical communication with the semiconductor absorber. The semiconductor absorber and dissipative conductor are capable of dissipating crosstalk radiation having a center frequency within a range, for example, between about 1 gigahertz and about 1,000 gigahertz.

In one embodiment according to the present invention, a microelectronic apparatus having protection against high frequency crosstalk radiation is provided, comprising: a planar insulating substrate; an active semiconductor electronic device located over a first region of said insulating substrate; and a doped semiconductor located in a second region of said insulating substrate substantially surrounding said first region. In another embodiment according to the present invention, such a microelectronic apparatus is provided in which said doped semiconductor fills a trench located in said second region. In an additional embodiment according to the present invention, such a microelectronic apparatus is provided, further comprising a dissipative conductor overlaying and adjacent to said doped semiconductor. In a further embodiment according to the present invention, such a microelectronic apparatus is provided further comprising: a second active semiconductor electronic device located over a third region of said insulating substrate, said third region being substantially separated from said first region by said second region. In another embodiment according to the present invention, such a microelectronic apparatus is provided further comprising: a dielectric passivation layer having a first surface overlaying said insulating substrate and having a second surface; said dielectric passivation layer having a thickness extending between said first and second surfaces; said dissipative conductor extending into said dielectric passivation layer. In an additional embodiment according to the present invention, such a microelectronic apparatus is provided in which said dissipative conductor fills a trench located in said dielectric passivation layer. In a further embodiment according to the present invention, such a microelectronic apparatus is provided further comprising: metallic test probe contacts located at said second surface, said metallic test probe contacts making electrical connections with said active semiconductor electronic device.

In another embodiment according to the present invention, a method of making a microelectronic apparatus having protection against high frequency crosstalk radiation is provided, comprising the steps of: providing a planar insulating substrate; forming an active semiconductor electronic device located over a first region of said insulating substrate; and forming a doped semiconductor located in a second region of said insulating substrate substantially surrounding said first region. In an additional embodiment according to the present invention, such a method is provided, further comprising the step of forming a dissipative conductor overlaying and adjacent to said doped semiconductor. In a further embodiment according to the present invention, such a method is provided, further comprising the step of forming a second active semiconductor electronic device located over a third region of said insulating substrate, said third region being substantially separated from said first region by said second region. In another embodiment according to the present invention, such a method is provided, further comprising the step of: forming a dielectric passivation layer having a first surface overlaying said insulating substrate and having a second surface; said dielectric passivation layer having a thickness extending between said first and second surfaces; said dissipative conductor extending into said dielectric passivation layer. In an additional embodiment according to the present invention, such a method is provided, further comprising the step of: forming metallic test probe contacts located at said second surface, said metallic test probe contacts making electrical connections with said active semiconductor electronic device.

A more complete understanding of the present invention, as well as other features and advantages of the invention, will be apparent from the following detailed description and the accompanying drawings.

BRIEF DESCRIPTION OF THE DRAWINGS

FIG. 9 is a flow chart for an exemplary method for fabricating a test transistor; and FIG. 10 is a flow chart for an exemplary method for fabricating a dissipative conductor and transistor probe contacts of a test transistor.

It should be emphasized that the drawings of the instant specification are not to scale but are merely schematic representations, and thus are not intended to portray the specific dimensions of the invention, which may be determined by skilled artisans through examination of the disclosure herein.

DETAILED DESCRIPTION

The present invention will now be described more fully with reference to the accompanying drawings, in which several presently preferred embodiments of the invention are shown. This invention may, however, be embodied in various forms and should not be construed as being limited to the embodiments set forth herein. Rather, these embodiments are provided so that this disclosure will be thorough and complete, and will illustrate the scope of the invention to those skilled in the art.

According to the present invention, conductive isolation frames are provided for integrated circuits, test transistors, and other active devices formed on semi insulating and highly insulating semiconductor wafers.

Figure 1:
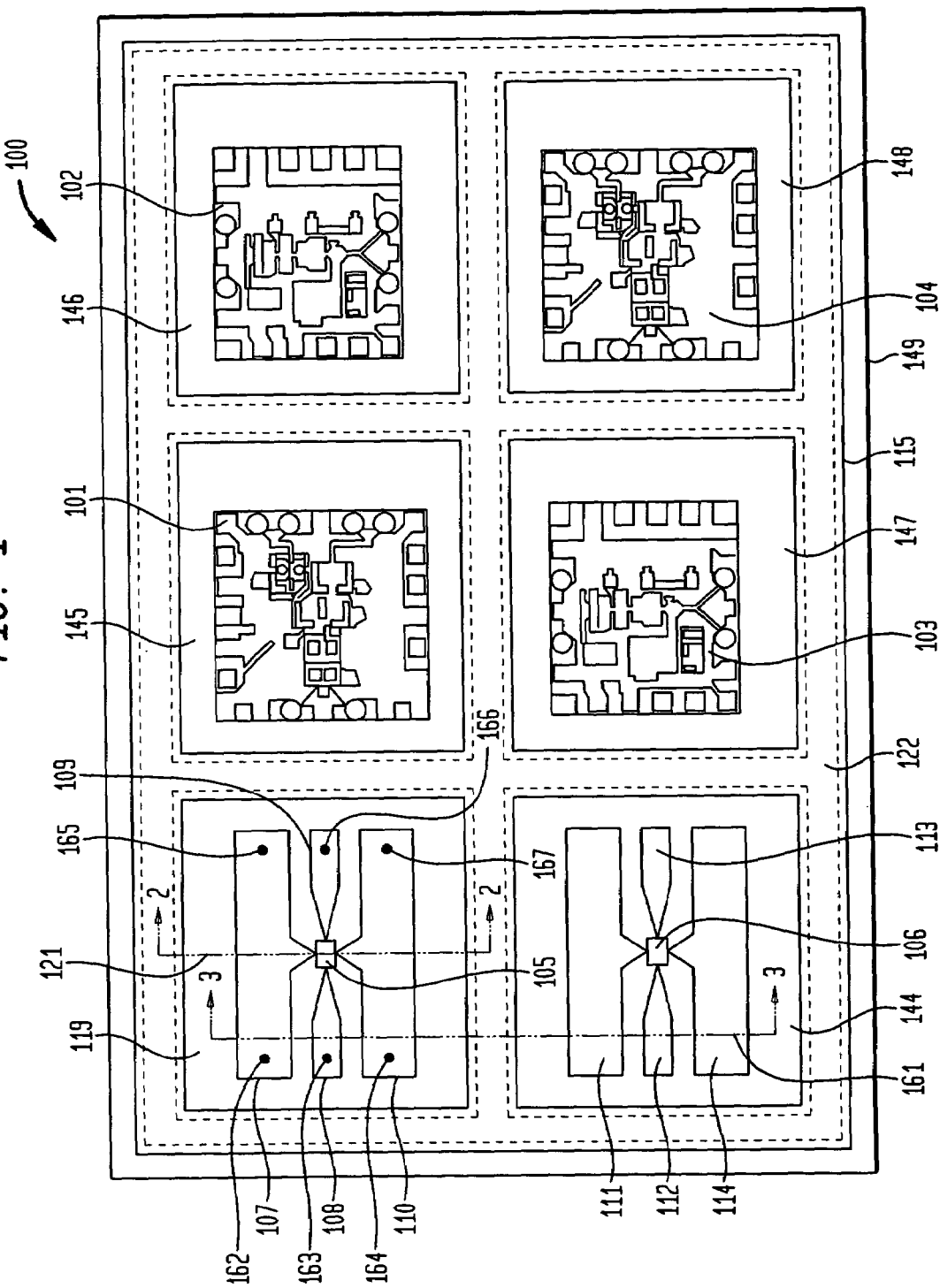
FIG. 1 shows an exemplary embodiment of a portion of a wafer containing semiconductor chips provided with a conductive isolation frame according to the present invention.

FIG. 1 shows one exemplary embodiment of a portion of a wafer 100 provided with a conductive isolation frame according to the present invention. The portion of the wafer 100 shown includes exemplary integrated circuits 101, 102, 103 and 104. The complete wafer exemplified by the portion 100 shown in FIG. 1 may contain, for example, about 100 integrated circuits. The portion of the wafer 100 shown also includes exemplary test transistors 105 and 106. Test transistors 105 and 106 are shown in a vastly magnified scale relative to the other elements of FIG. 1. Test transistor 105 includes test probe contacts 107, 108, 109 and 110 collectively constituting a test measurement frame. Test transistor 106 includes test probe contacts 111, 112, 113 and 114, also collectively constituting a test measurement frame. The portion of the wafer 100 shown further includes dissipative conductor 115.

Figure 2:
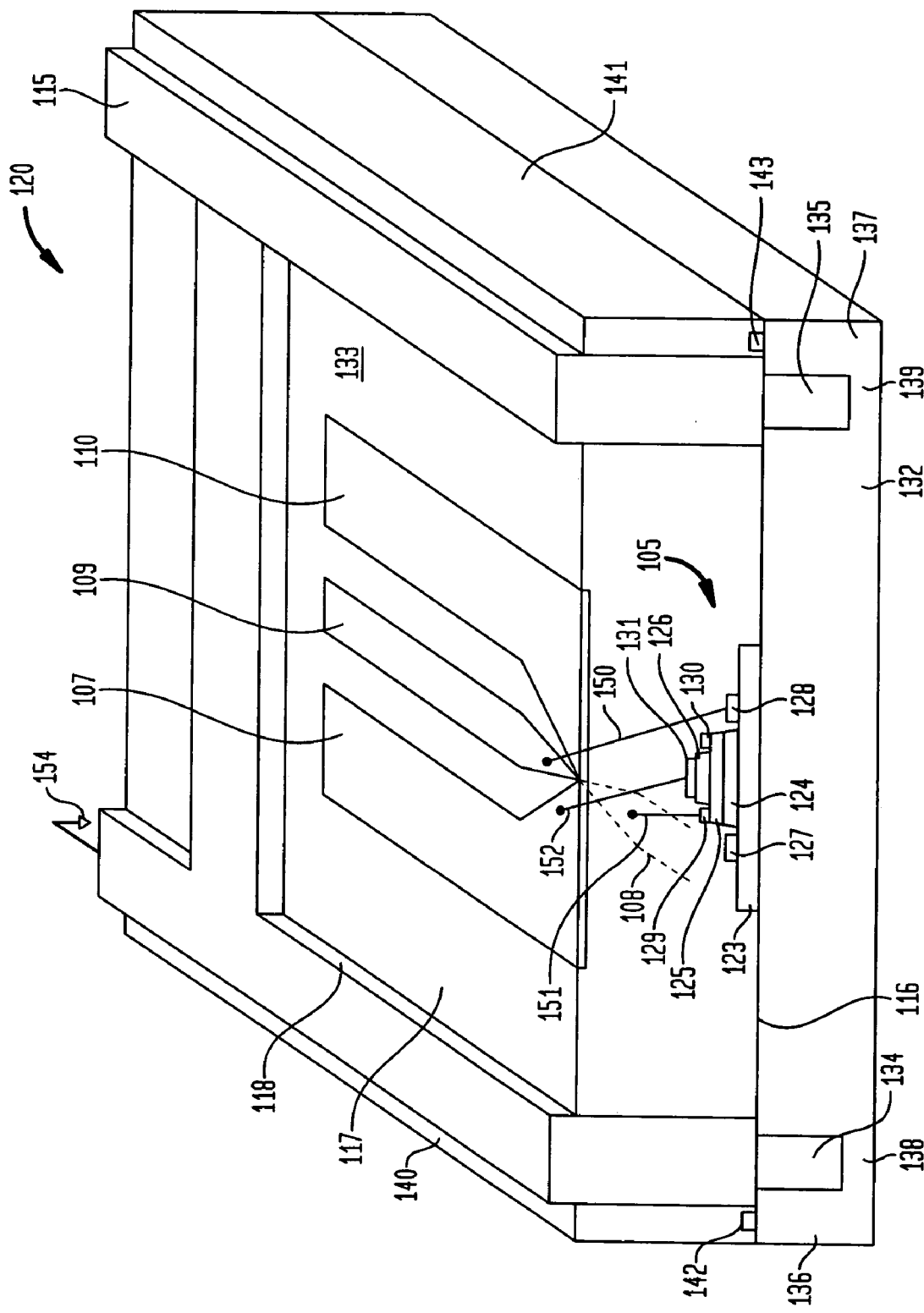
FIG. 2 shows a section of the portion of a wafer containing semiconductor chips shown in FIG. 1.

FIG. 2 shows a section 120 of the portion 100 of a wafer. The section 120 shown in FIG. 2 is located by the dotted line 121 in FIG. 1. FIG. 2 shows a cross section of transistor 105. The transistor 105 includes a subcollector 123, a collector 124, a base 125, and an emitter 126. The subcollector 123 includes collector contacts 127 and 128. The base 125 includes base contacts 129 and 130. The emitter 126 includes an emitter contact 131. The subcollector 123 is supported by an insulating substrate 132. In this context, "insulating" means that the substrate has a reduced capability to conduct electrons and holes and thus can be described as being a semi insulating material. However, the scope of meaning of "insulating" also includes and extends to a substrate having a minimal capability to conduct electrons and holes that can thus be described as highly insulating. Both semi insulating and highly insulating materials are substantially unable to carry a current of electrons or holes under the normal operating conditions of the device into which the subject materials are incorporated. In one embodiment according to the present invention, the insulating substrate 132 is a planar wafer. In this context, "planar" means that the wafer is substantially although in general not perfectly planar. The transistor 105 is covered by a dielectric passivation layer 133. In this context, "dielectric" means that the passivation layer is a highly insulating material. FIG. 2 further shows test probe contact 109 and portions of test probe contacts 107 and 110.

The insulating substrate 132 contains a semiconductor absorber 122 shown in FIG. 1 and exemplified by absorber trench subregions 134 and 135 shown in FIG. 2, which are overlaid by dissipative conductor 115. FIG. 2 shows that the dissipative conductor 115 fills a trench in the dielectric passivation layer 133. In one embodiment according to the present invention, the dissipative conductor 115 spans the thickness of the dielectric passivation layer 133, from a first surface 116 adjacent to the insulating substrate 132, to a second surface 117. In the exemplary embodiment shown in FIG. 2, the dissipative conductor 115 extends beyond the second surface 117 in exemplary portion 118. In a further embodiment according to the present invention, the dissipative conductor 115 extends beyond the first surface 116 into the insulating substrate 132. In another embodiment according to the present invention, the dissipative conductor 115 spans a portion of the thickness of the dielectric passivation layer 133, such as at least about half of such thickness, either from the first surface 116 toward the second surface 117, or from the second surface 117 toward the first surface 116, or between two points that are both entirely within the dielectric passivation layer 133.

The dissipative conductor 115 and the semiconductor absorber 122 substantially surround each of the integrated circuits 101, 102, 103 and 104 as well as test transistors 105 and 106. In this context, "substantially" means that gaps and imperfections can be present in the subject elements of the apparatus so long as they do not interfere with its function and operation as described. The semiconductor absorber 122 together with the dissipative conductor 115, collectively constitute a conductive isolation frame for transistor 105.

As can be seen in FIG. 2, the exemplary absorber trench subregions 134 and 135 of the semiconductor absorber 122 are imbedded within the insulating substrate 132. The exemplary absorber trench subregions 134 and 135 of the semiconductor absorber 122 are in electrical communication with the dissipative conductor 115, and are otherwise isolated within the insulating substrate 132 by exemplary portions 136, 137, 138 and 139 of the insulating substrate 132. The dissipative conductor 115 is in electrical contact with the semiconductor absorber 122, but is otherwise electrically isolated by dielectric passivation layer 133 including regions 140 and 141. Alignment marks 142 and 143, provided for accurate positioning of transistor 105 during its fabrication, overlay the insulating substrate 132 and are embedded in dielectric passivation layer 133. In the exemplary embodiment according to the present invention as shown in FIG. 1, integrated circuits 101, 102, 103 and 104 are also included in the portion 100 of a wafer, and the semiconductor absorber 122 surrounds regions of the insulating substrate 132 underlying each of such exemplary integrated circuits as well.

The integrated circuits 101, 102, 103 and 104 shown in FIG. 1 can be appropriately interconnected with each other and with the remaining integrated circuits on the wafer to constitute a system by additional metal traces, not shown. The integrated circuits are also connected by additional metal traces not shown, to other components not contained on the wafer and that are intended to carry the signals propagated through the integrated circuits, and to a suitable power source to supply the necessary direct current bias. Each of the test transistors 105 and 106 is electrically isolated from the other test transistor and from the integrated circuits. In one embodiment according to the present invention, the dissipative conductor 115 is suitably grounded as shown at 154. Referring to FIG. 1, the dissipative conductor 115 is electrically isolated from each of test transistors 105 and 106, as well as from integrated circuits 101, 102, 103 and 104, by passivation regions 119, 144, 145, 146, 147, and 148 respectively. The dissipative conductor 115 is further surrounded by dielectric region 149.

The subcollector 123, collector 124, base 125, and emitter 126 are in serial electrical contact. The collector contacts 127 and 128 are in electrical contact with the subcollector 123. The base contacts 129 and 130 are in electrical contact with the base 125. The emitter contact 131 is in electrical contact with the emitter 126. The exemplary collector contact 128 is in electrical communication with the test probe contact 109 by conductor 150. The exemplary base contact 129 is in electrical communication with the test probe contact 108 shown in FIG. 2 with a dotted line, by conductor 151. Test probe contacts 107 and 110 are physically connected together. The emitter contact 131 is in electrical communication with test probe contacts 107 and 110 by conductor 152.

Each of the exemplary integrated circuits 101, 102, 103 and 104 can be any suitable integrated circuit fabricated on a wafer using semiconductor technology. Such integrated circuits typically include a collection of active components including transistors, diodes and memory cells for example, metal traces that conduct signals between these components, and insulating material that separates the metal traces from each other according to the integrated circuit layout.

Each of the test transistors 105 and 106 may be any suitable transistor device fabricated in semiconductor materials on a wafer. In one embodiment according to the present invention, test transistors 105 and 106 are double heterojunction bipolar transistors (DHBTs). Bipolar transistors are fabricated from p and n type semiconductor materials. N type semiconductor materials comprise excess free electrons, and p type semiconductor materials comprise free holes. N type semiconductor materials can conduct an electrical current by the transfer of free electrons. N type semiconductors thus carry a negative current of electrons. P type semiconductor materials can conduct an electrical current by the transfer of holes and thus carry a positive current of holes.

One type of bipolar junction transistor, referred to as an NPN transistor, comprises two layers of an n type semiconductor with a layer of a p type semiconductor sandwiched in between. The middle layer receives an input signal to be amplified or switched, and is referred to as the base. One of the two outside layers receives an electrical power input and is referred to as the emitter. The other of the two outside layers provides an electrical power output from the transistor and is referred to as the collector. The voltage of the base must be more positive than that of the emitter, and the voltage of the collector must be more positive than that of the base. Modulation of an electrical signal input to the base controls the output to the collector. A small current input to the base can control a much larger current flowing from the emitter to the collector.

Another type of bipolar junction transistor, referred to as a PNP transistor, comprises two layers of a p type semiconductor with a layer of an n type semiconductor sandwiched in between. The middle layer again receives an input signal to be amplified or switched, and is referred to as the base. One of the two outside layers receives an electrical power input and is referred to as the emitter. The other of the two outside layers provides an electrical power output from the transistor and is referred to as the collector. The voltage of the base must be more positive than that of the collector, and the voltage of the emitter must be more positive than that of the base. Modulation of an electrical signal input to the base controls the output to the collector. A negative current flows from the emitter to the collector in an NPN transistor, whereas a positive current flows from the emitter to the collector in a PNP transistor. Electrons travel more rapidly than holes. Accordingly, NPN transistors are generally preferred, particular in the contemplated applications for carrying signals at frequencies in excess of 1 Ghz. However, PNP transistors, and combinations of PNP and NPN transistors, can also be used.

Other types of transistors, such as field effect transistors for example, can also be used. Exemplary types of field effect transistors include junction field effect transistors (JFET) and metal oxide semiconductor field effect transistors (MOSFET). Further, semiconductor diodes, typically comprising a single layer of an n type material bound to a single layer of a p type material, can also be used.

Figure 3:
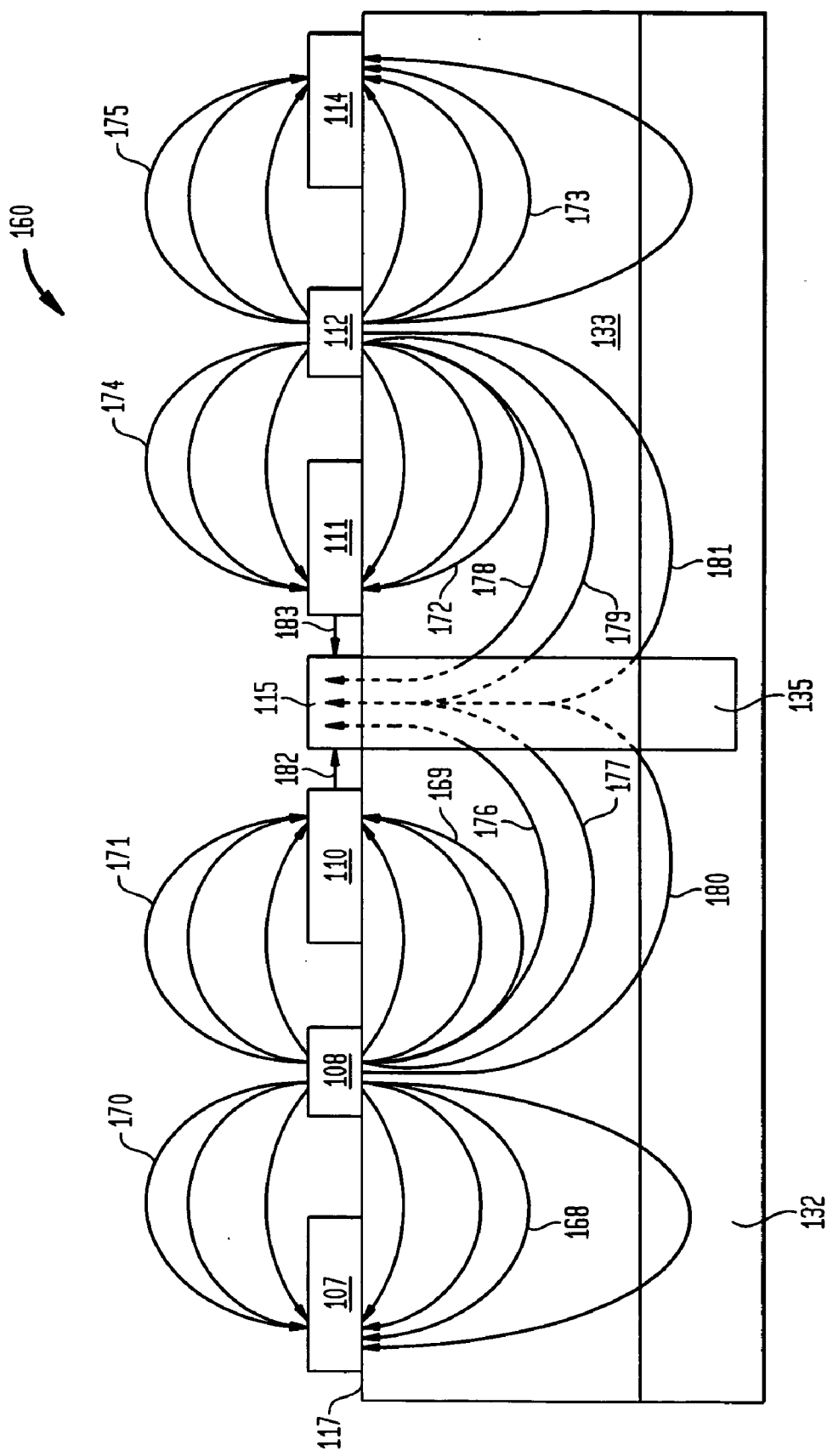
FIG. 3 shows another section of the portion of a wafer containing semiconductor chips shown in FIG. 1, during the application of test signals to the test probe contacts of transistors.

FIG. 3 shows a section 160 of the portion 100 of a wafer during the application of a test signal to test probe contact 108 of transistor 105 and to test probe contact 112 of transistor 106. The section 160 shown in FIG. 3 is located by the dotted line 161 in FIG. 1. FIG. 3 shows test probe contacts 107, 108, 110, 111, 112 and 114. FIG. 3 also shows that such test probe contacts are supported by the insulating substrate 132 and the dielectric passivation layer 133. FIG. 3 further shows portions of absorber trench subregion 135 of the semiconductor absorber 122 between transistors 105 and 106, which is overlaid by dissipative conductor 115.

Referring again to FIG. 1, operation of each of the test transistors 105 and 106 is carried out by applying test probes to the appropriate test probe contacts. In order to test the operation of exemplary test transistor 105, input test probes are applied to test probe contacts 107, 108 and 110 at points 162, 163 and 164, and output test probes are applied to test probe contacts 107, 109 and 110 at points 165, 166 and 167.

Exemplary test transistors 105 and 106 are bipolar NPN transistors. An input test signal is applied by an input test probe at point 163 which is in communication with base contact 129. An output test signal is collected by an output test probe at point 166 which is in communication with collector contact 128. The input test probes applied at points 162 and 164, and the output test probes applied at points 165 and 167, are all in communication with emitter contact 131. The emitter 126 serves as the ground in this transistor test layout. The test signal is input to the base 125 through point 163 and is output from the subcollector 123 through point 166. The test signal is carried by the output test probe to suitable testing equipment for wafer manufacturing quality control analysis. Referring to FIG. 1, point 163 is bracketed by points 162 and 164, and point 166 is bracketed by points 165 and 167. Hence, this transistor test layout is described as a ground signal ground (GSG) configuration. This test operating layout surrounds the test probe contacts that carry the test signal by grounded test probe contacts, thereby providing relatively greater stability in the high frequency testing signal. The GSG configuration is particularly useful for testing active devices with signals having a frequency in excess of 1 Ghz.

In addition to providing the desired transmissions of test signals, application of the high frequency test signals to test transistors 105 and 106 also results in the propagation of undesirable electromagnetic radiation. Referring to FIG. 3, the test signal is input to the base 125 of test transistor 105 through test probe contact 108. The high frequency signal introduced into test probe contact 108 may, for example, be a microwave, millimeter or submillimeter signal, having a frequency within a range between about 1 Ghz and about 1000 Ghz. Accordingly, an electromagnetic field is generated in the vicinity of test probe contact 108 of test transistor 105 with field lines emanating through the dielectric passivation layer 133 and the insulating substrate 132 in the direction of test probe contact 107 and in the direction of test probe contact 110 as shown by arrows 168 and 169. Electromagnetic field lines also emanate over the second surface 117 of the passivation layer 133, as shown by arrows 170 and 171. The field lines indicated by arrows 170 and 171 are relatively weak, however, because dielectric airspace overlies test probe contacts 107, 108 and 110 of exemplary test transistor 105 as can be seen in FIG. 2. Similarly, an electromagnetic field can be generated in the vicinity of test probe contact 112 of test transistor 106 with field lines emanating through the dielectric passivation layer 133 and the insulating substrate 132 in the direction of test probe contacts 111 and 114 as shown by arrows 172 and 173. Relatively weak electromagnetic field lines also emanate over the second surface 117 of the passivation layer 133, as shown by arrows 174 and 175.

Some of the field lines of the electromagnetic radiation may, as shown by exemplary arrows 176, 177, 178 and 179, extend into the dissipative conductor 115. Further field lines of the electromagnetic radiation may, as shown by exemplary arrows 180 and 181, extend into exemplary absorber trench subregion 135 occupied by the semiconductor absorber 122. Since the absorber trench subregion 135 of the semiconductor absorber 122, and the dissipative conductor 115 are electrically connected together, electromagnetic radiation carried on such field lines is dissipated due to ohmic resistance and skin depth effects. If desired, the semiconductor absorber 122 and the dissipative conductor 115 can also be routed to ground as shown at 154 in FIG. 1. It can be seen that, were the exemplary absorber trench subregion 135 of the semiconductor absorber 122 and the dissipative conductor 115 omitted, electromagnetic radiation on field lines 176, 177 and 180 emanating from transistor 105 could potentially reach test probe contacts 111, 112 or 114 in electrical communication with neighboring transistor 106. It can further be seen that, were the exemplary absorber trench subregion 135 of the semiconductor absorber 122 and the dissipative conductor 115 omitted, electromagnetic radiation on field lines 178, 179 and 181 emanating from transistor 106 could potentially reach test probe contacts 107, 108 or 110 in electrical communication with neighboring transistor 105. It can also be seen that were the exemplary absorber trench subregion 135 of the semiconductor absorber 122 and the dissipative conductor 115 omitted, electromagnetic radiation on field lines 182 and 183 respectively emanating from test probe contacts 110 and 111 could potentially be directly transferred from one of such test probe contacts to the other. The greatest density of the electromagnetic fields is in this region that is coplanar with the test probe contacts. Dissipation of the electromagnetic radiation emanating on exemplary field lines 168, 169, 172, 173, and 176–181 also disrupts and thus eliminates the electromagnetic radiation emanating on exemplary field lines 170, 171, 174 and 175. If any of these exemplary field lines were to so reach an adjacent test transistor, the manufacturing quality control test results could be distorted and thus invalidated. The conductive isolation frame, including dissipative conductor 115 and semiconductor absorber 122, prevents electromagnetic radiation from emanating on such field lines. Accordingly, the accuracy and reliability of the manufacturing quality control test results obtainable from test transistors 105 and 106 are increased.

Referring again to FIG. 1, each of integrated circuits 101, 102, 103 and 104 is surrounded by the conductive isolation frame constituted by the dissipative conductor 115 and the underlying semiconductor absorber 122. In operation, each of the integrated circuits such as exemplary integrated circuits 101, 102, 103 and 104 is protected against crosstalk radiation in the same manner as explained above with regard to test transistors 105 and 106 as shown in FIG. 3. Field lines of electromagnetic radiation that otherwise potentially could reach an adjacent integrated circuit are directed into the conductive isolation frame and are harmlessly dissipated.

Figure 4:
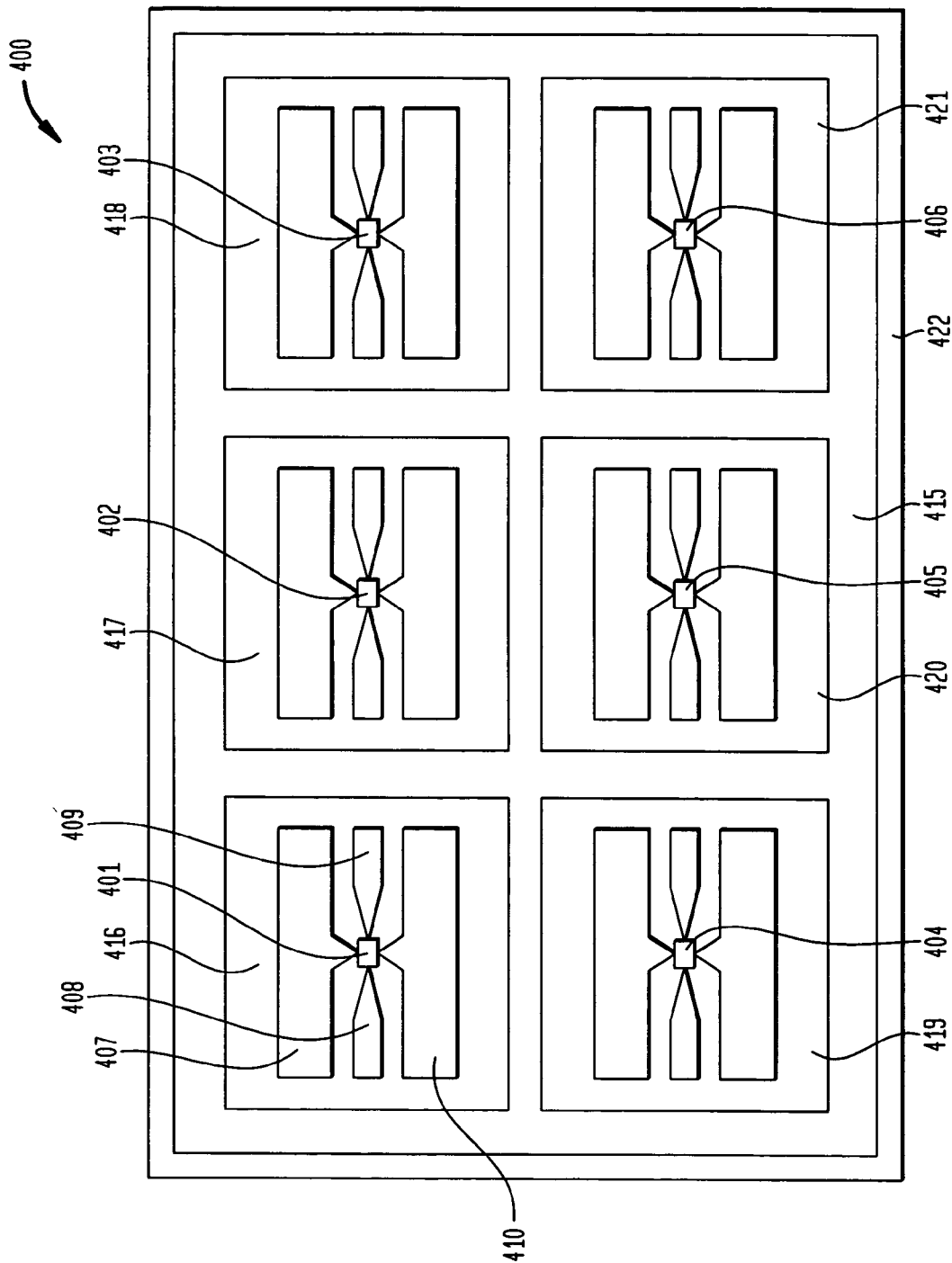
FIG. 4 shows another exemplary embodiment of a portion of a wafer containing semiconductor chips provided with a conductive isolation frame according to the present invention.

FIG. 4 shows another exemplary embodiment of a portion of a wafer 400 provided with a conductive isolation frame according to the present invention. The portion of the wafer 400 shown includes exemplary test transistors 401, 402, 403, 404, 405 and 406. The complete wafer exemplified by the portion 400 shown in FIG. 4 may contain, for example, any desired number of additional test transistors, as well as other active devices. Exemplary test transistor 401 includes test probe contacts 407, 408, 409 and 410. Exemplary test transistors 402, 403, 404, 405 and 406 also contain test probe contacts. The portion of the wafer 400 shown further includes dissipative conductor 415. Each of the test transistors 401, 402, 403, 404, 405 and 406 is electrically isolated from the other test transistors. The dissipative conductor 415 can, if desired, be suitably grounded. The dissipative conductor 415 is electrically separated from each of test transistors 401, 402, 403, 404, 405 and 406 by passivation regions 416, 417, 418, 419, 420 and 421, respectively. The dissipative conductor 415 is further surrounded by dielectric region 422. Operation of each of the test transistors 401, 402, 403, 404, 405 and 406 is carried out by applying test probes to the appropriate test probe contacts in the same manner as described above in connection with test transistors 105 and 106.

Figure 5:
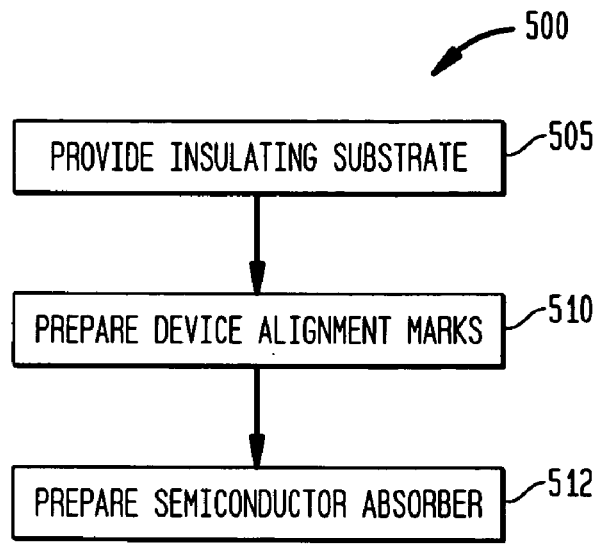
FIG. 5 is a flow chart for an exemplary method for fabricating an insulating substrate having a semiconductor absorber in accordance with the present invention.

FIG. 5 shows an exemplary method 500 for providing the insulating substrate 132 shown in FIGS. 2 and 3 with the semiconductor absorber 122. Fabrication of these combined elements constitutes the first stage in production of the completed devices shown in FIGS. 1–4.

In step 505, a suitable insulating substrate 132 having deep electron traps is provided. For example, the insulating substrate 132 may be an indium phosphide crystal wafer doped, for example by ion implantation, with iron. Indium phosphide itself is not a sufficiently dielectric material. Ion-implanted iron is included as a dopant in appropriate small proportions such as, for example, within a range between about $1 \times 10^{-3}$ and about $1 \times 10^{-8}$% by weight. Iron acts to create dislocations in the indium phosphide crystal. These dislocations are deep electron traps in the middle of the band gap of indium phosphide, causing the indium phosphide crystal to be insulating. Alternatively, the insulating substrate 132 may be a gallium arsenide wafer including a suitable dopant such as chromium. Such a dopant may be added in a minor proportion suitable to provide deep electron traps such as, for example, within a range between about $1 \times 10^{-3}$ and about $1 \times 10^{-8}$% by weight. Other wafer materials compatible with semiconductor fabrication may also be used, provided that they are or can be made insulating. Other dopants providing deep electron traps for the chosen substrate material can be used, and other dopants having properties that are desirable for other purposes may be added, provided that the insulating state and semiconductor compatibility of the insulating substrate 132 are not adversely affected. Further, if desired the insulating substrate 132 may itself be supported by a suitable rigid material.

In step 510, the insulating substrate 132 is provided with device alignment marks. Referring to FIG. 2, exemplary device alignment marks 142 and 143 can be seen. The device alignment marks 142 and 143 are outside the perimeter formed around exemplary test transistor 105 by the dissipative conductor 115. Hence, the device alignment marks 142 and 143 are located over a region of the insulating substrate 132 where they do not interfere with the preparation or operation of the exemplary test transistor 105. The device alignment marks 142 and 143, like the transistor 105 itself, are embedded in the dielectric passivation layer 133. Hence, prior to deposition of the dielectric passivation layer 133, the device alignment marks 142 and 143 are visibly exposed and can be used for alignment purposes in executing steps to fabricate the various layers and contacts of the exemplary test transistor 105 during its fabrication. The device alignment marks 142 and 143 can also aid in positioning of the exemplary test transistor 105 relative to the semiconductor absorber 122. Device alignment marks 142 and 143 can thus assist in the transistor fabrication process. However, if other suitable provisions are made for transistor alignment, then the steps collectively indicated at 510 and the resultant exemplary device alignment marks 142 and 143 can be omitted.

In step 512, the insulating substrate 132 is then provided with semiconductor absorber 122. On the one hand, exemplary test transistor 105 is a minute and delicate device necessarily fabricated to meet exacting standards. On the other hand, the semiconductor absorber 122 is a relatively massive feature. In order to prevent step 512 from in any way damaging the exemplary test transistor 105, step 512 is preferably completed before fabrication of exemplary test transistor 105. However, if desired, for example as dictated by overall efficiencies in the procedures for fabricating exemplary portion 100 of a wafer, the order of these method steps can be reversed if desired.

Figure 6:
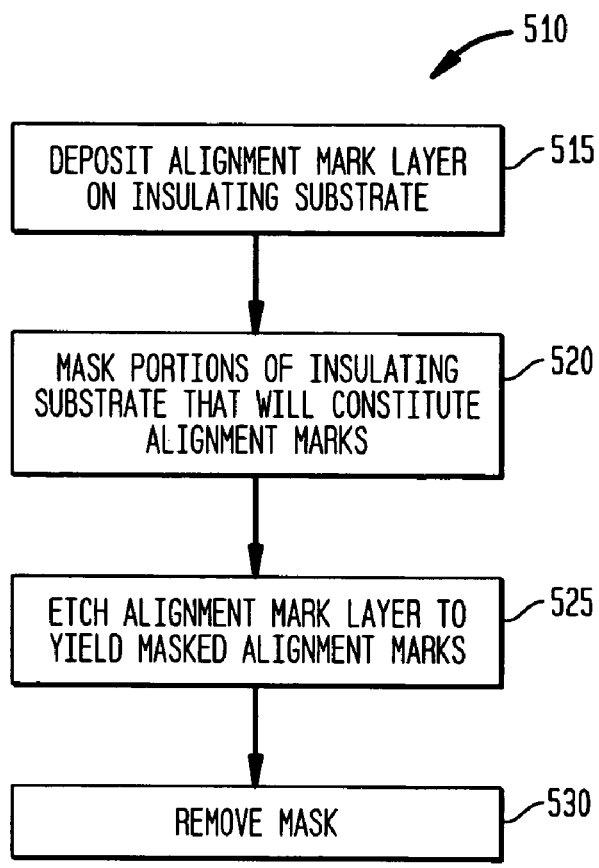
FIG. 6 is a flow chart for an exemplary method for fabricating device alignment marks in accordance with the present invention.

FIG. 6 shows an exemplary method for carrying out step 510 shown in FIG. 5 to prepare device alignment marks. In step 515, an alignment mark layer is deposited on the insulating substrate 132. Where the insulating substrate 132 is fabricated from doped indium phosphide, for example, the alignment mark layer may be indium gallium arsenide. The crystal lattice constant of indium gallium arsenide is substantially equivalent to that of indium phosphide. These similar lattice constants promote bonding of indium phosphide and indium gallium arsenide together without crystal dislocations. However, other semiconductors can be substituted, provided that suitable etchants are available and provided that the resultant alignment marks are adequately visible for use. Although metals can also be used, their conductivity serves no purpose in operation of the active devices and accordingly they are less preferred.

The alignment marks are fabricated using processes that are compatible with processes used to fabricate the exemplary test transistor 105 itself shown in FIGS. 1 and 2. The exemplary indium gallium arsenide layer is deposited onto the insulating substrate 132 by a suitable chemical vapor deposition (CVD) process or physical vapor deposition (PVD) process such as, for example, low pressure chemical vapor deposition (LPCVD), atmospheric pressure chemical vapor deposition (APCVD), or plasma enhanced chemical vapor deposition (PECVD). LPCVD is preferred, as APCVD can result in poor coating uniformity and purity, and PECVD can result in plasma damage to the insulating substrate 132. Other processes typically used for precision manufacture of active devices such as transistors can also be used. Such processes include, for example, metal organic chemical vapor deposition (MOCVD) and molecular beam epitaxy (MBE). An exemplary type of MBE is metal organic molecular beam epitaxy (MOMBE). In an MOMBE process, for example, the epitaxy gas mixture changes to sequentially produce various doped semiconductor layers to be included in the active device.

In one embodiment according to the present invention, the thickness of the exemplary indium gallium arsenide alignment mark layer is within a range between about 100 nanometers (nm) and about 1000 nm.

In step 520 those portions of the alignment mark layer that will constitute the exemplary device alignment marks 142 and 143 are masked. The masking is carried out, for example, by applying a photoresist to the alignment mark layer that is suitable for development into a mask. The developed mask composition is resistant to an etchant solution capable of dissolving the alignment mark layer. The photoresist is then developed by light directed only onto those portions of the photoresist overlaying the designed device alignment marks. Such portions of the photoresist thus become a protective mask that can prevent the etchant from dissolving the underlying portions of the alignment mark layer.

In step 525, the etchant is applied to the alignment mark layer. The etchant can be, for example, a liquid suitable for etching the exemplary indium gallium arsenide composition of the alignment mark layer. Suitable etchants for indium gallium arsenide can include, for example: a mixture comprising phosphoric acid, hydrogen peroxide and water; a mixture comprising acetic acid, hydrogen peroxide and water; or a mixture comprising sulfuric acid, hydrogen peroxide and water. In addition, dry plasma etching processes and other types of etching processes can be used. Following completion of the etching process, the etchant is removed.

In step 530, the protective mask overlying the remaining device alignment marks is removed. The protective mask can be removed, for example, by application of a suitable solvent such as acetone or N-methylpyrrolidone (NMP). The insulating substrate 132 is thus provided with the exemplary device alignment marks 142 and 143, all other portions of the alignment mark layer having been removed by the etchant.

Figure 7:
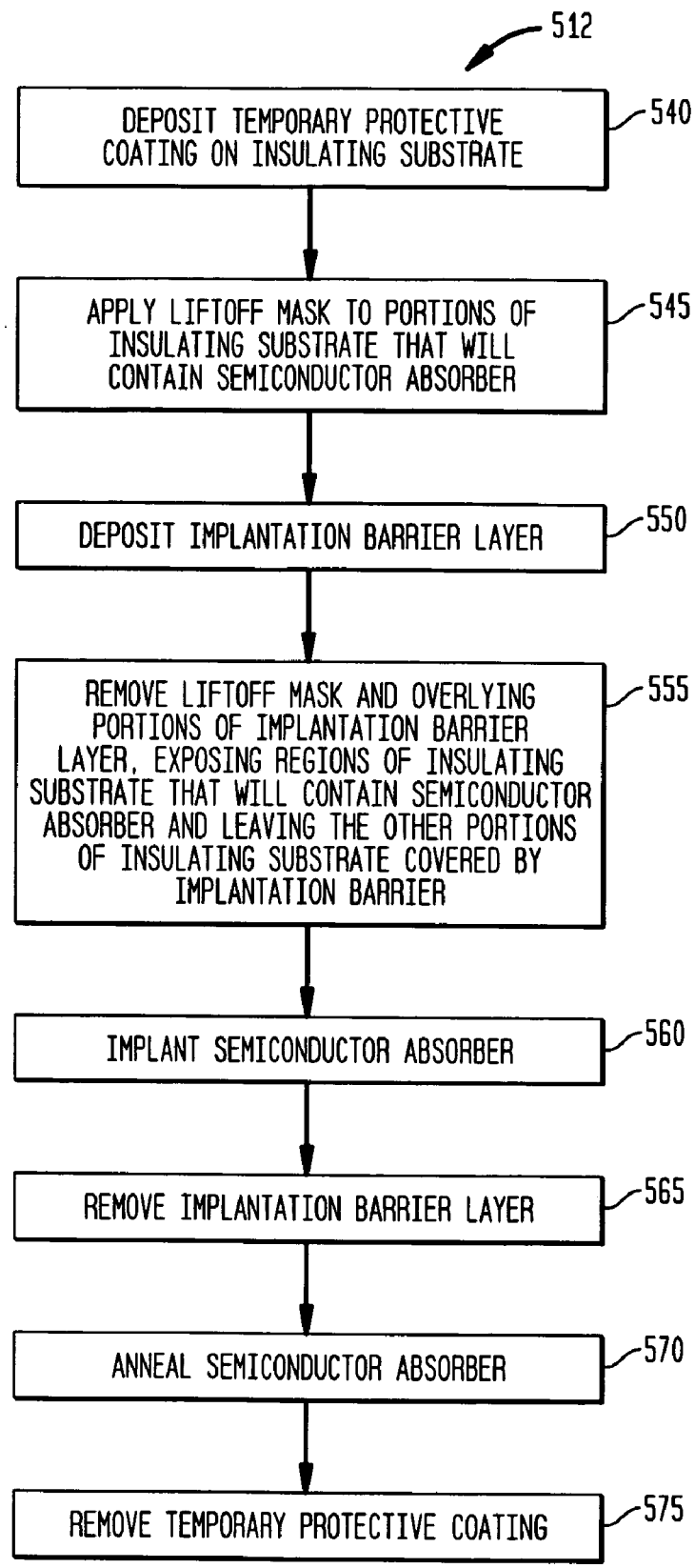
FIGS. 7 and 8 are flow charts for exemplary methods for fabricating a semiconductor absorber in accordance with the present invention.

FIG. 7 shows an exemplary method for carrying out step 512 shown in FIG. 5 for fabricating a semiconductor absorber in accordance with the present invention.

In order to protect the insulating substrate 132 from damage caused by the series of manipulations in step 512, the insulating substrate 132 may, if desired, be provided with a temporary protective coating in step 540. Such a temporary protective coating is made to be compatible with the other specific substeps within step 512 as shown in FIG. 7. For example, the protective coating should not impede production of the semiconductor absorber. In one exemplary embodiment according to the present invention, the temporary protective coating is a layer of silicon nitride. In alternative exemplary embodiments according to the present invention, the temporary protective coating is a layer of aluminum oxide, indium gallium arsenide, or silicon dioxide. The protective coating can be applied to the insulating substrate 132 using a suitable chemical vapor deposition process. In one exemplary embodiment according to the present invention, PECVD is employed to deposit a silicon nitride layer at a temperature of about 250° C. having a thickness of about 50 nm. Suitable deposition temperatures are dictated by the PECVD process and by the selected composition for the protective coating layer. Suitable protective coating layer thicknesses are those that are adequate to protect the insulating substrate 132 while not adversely affecting the fabrication steps. In one embodiment according to the present invention, the thickness of the temporary protective coating layer is within a range between about 20 nm and about 100 nm. Other chemical vapor deposition processes can be employed. Highly pure or precise results typically are not required in deposition of the temporary protective coating layer.

In one embodiment according to the present invention, semiconductor absorber 122 is produced in step 560 by performing a dopant implantation in insulating substrate 132. In general, a dopant composition suitable for creating conductive regions is implanted into desired areas of the insulating substrate 132. During the implantation, selected areas of the insulating substrate 132 to be doped are exposed to the implantable dopants. For example, referring to FIG. 1, the areas of the exemplary portion 100 of a wafer to be occupied by semiconductor absorber 122 are selectively exposed to such implantable dopants.

In order for such a selective implantation process to be carried out, the area of the exemplary portion 100 of a wafer not to be occupied by semiconductor absorber 122 is masked. In one exemplary embodiment according to the present invention, a liftoff masking process is used in steps 545, 550 and 555 to provide such effective masking.

In one exemplary embodiment according to the present invention, step 545 is carried out by applying a suitable liftoff photoresist to the temporary protective coating layer. Those portions of the photoresist that are within the area of the exemplary portion 100 of a wafer to be occupied by semiconductor absorber 122, are then exposed to radiation for developing the photoresist. The developed portions of the photoresist are then removed from the temporary protective coating layer by suitable means, such as by dissolution in a solvent, when desired.

In step 550, a suitable implantation barrier layer is then deposited over the temporary protective layer. The purpose of the implantation barrier layer is to selectively serve as a robust obstacle to penetration into the insulating substrate 132 by the ions that will be implanted to create the semiconductor absorber 122. In one exemplary embodiment according to the present invention, the implantation barrier layer is constituted by a layer of gold deposited over a layer of titanium. For example, a layer of titanium having a thickness of about 5 nm can be deposited on the temporary protective coating layer, followed by deposition of a layer of gold having a thickness of about 150 nm. These metal layers can be deposited, for example, using an evaporative metal deposition process. The thickness of the titanium layer may be, for example, within a range between about 3 nm and about 20 nm. The thickness of the gold layer may be, for example, within a range between about 100 nm and about 1000 nm. Other metals can be substituted provided that they produce an effective barrier to the implantable dopants. In addition, silicon dioxide, silicon nitride, indium gallium arsenide, or a suitable photoresist can be used.

In step 555, the liftoff mask and overlying portions of the implantation barrier layer are stripped from the insulating substrate 132. The method used to carry out this step depends on the composition of the selected liftoff mask, and may include, for example, applying a suitable solvent to the implantation barrier layer. Upon completion of this step, those portions of the insulating substrate 132 to be occupied by the semiconductor absorber 122 are revealed, covered only by the temporary protective coating layer. All other portions of the insulating substrate 132 are covered by the implantation barrier layer.

In step 560, the semiconductor absorber is implanted through the temporary protective coating layer into the insulating substrate 132. In one embodiment according to the present invention, the selected dopant contains n type semiconductor atoms. Implantation of n type dopant atoms into the desired regions of the insulating substrate 132 converts such regions into n type semiconductors and enables them to carry a current of electrons. Suitable exemplary n type dopant atoms include elements of groups 4A and 6A of the periodic table, such as, for example, sulfur, silicon, germanium, selenium, tin, tellurium, and mixtures. Phosphorus and arsenic, which both are group 5A elements, can be coimplanted with elements of groups 4A and 6A. Although p type dopant atoms can alternatively be employed, the resulting p type semiconductor regions conduct hole currents, which move more slowly than do electron currents. Suitable p type atoms for dopant implantation include carbon, beryllium, magnesium, zinc and cadmium. In another embodiment according to the present invention, any suitable charge carrying semiconductor dopant can be employed. The portions of the insulating substrate 132 that thus become a doped semiconductor, constitute the semiconductor absorber 122 having the capability to transport charge carriers.

In one embodiment according to the present invention, the exemplary n type atoms employed are sulfur atoms. For example, such sulfur atoms can be directed into the insulating substrate 132 using an ion implanter. Exemplary conditions for ion implanting of sulfur into an exemplary indium phosphide insulating substrate 132 include sulfur ion energies within a range between about 50 thousand electron volts (keV) and about 530 keV, a sulfur ion dosage within a range between about $2 \times 10^{14}$ and about $1 \times 10^{15}$ sulfur atoms per square centimeter ($cm^2$), and an insulating substrate temperature of about 300° C. In one embodiment according to the present invention, sulfur ions are implanted into the insulating substrate 132 at an angle from the normal direction to the surface of the temporary protective coating layer. Ions implanted into the insulating substrate 132 at the normal direction may channel relatively unimpeded through the crystal lattice of the insulating substrate 132, and thus not be evenly distributed as desired within the insulating substrate. For example, a tilt angle within a range between about 5° and about 10°, or about 7°, can be employed. Upon completion of step 560, the implanted regions of the insulating substrate 132 are thus converted to n type semiconductors, forming the semiconductor absorber 122 as shown in FIGS. 1 and 2.

In step 565, the implantation barrier layer is removed. For example, this removal can be carried out by using an etchant capable of dissolving the selected implantation barrier layer. Potassium iodide, for example, is a suitable etchant for gold and titanium layers.

In step 570, the implanted semiconductor absorber 122 is annealed. Annealing of the semiconductor absorber 122 reduces misalignments within the crystal lattice of the insulating substrate 132, improves uniformity of distribution of the n type sulfur atom dopants, and activates the dopants by enabling the implanted atoms to move into lattice positions. In one exemplary embodiment according to the present invention, this annealing step 570 is carried out by maintaining the insulating substrate 132 at a temperature within a range between about 750° C. and about 850° C. for a time period within a range between about 5 seconds and about 15 seconds. After such annealing, the magnitude of the resulting increase in the electronic conductivity of the semiconductor absorber 122 relative to the electronic conductivity of the insulating substrate 132 is typically within a range between about 100 and about 100,000,000.

In step 575, the temporary protective coating layer is removed, for example by application of a suitable etchant. For example, hydrogen fluoride buffered with ammonium fluoride is a suitable etchant for silicon nitride. The resulting insulating substrate 132 and implanted semiconductor absorber 122 are then ready for fabrication of the dissipative conductor 115.

Figure 8:
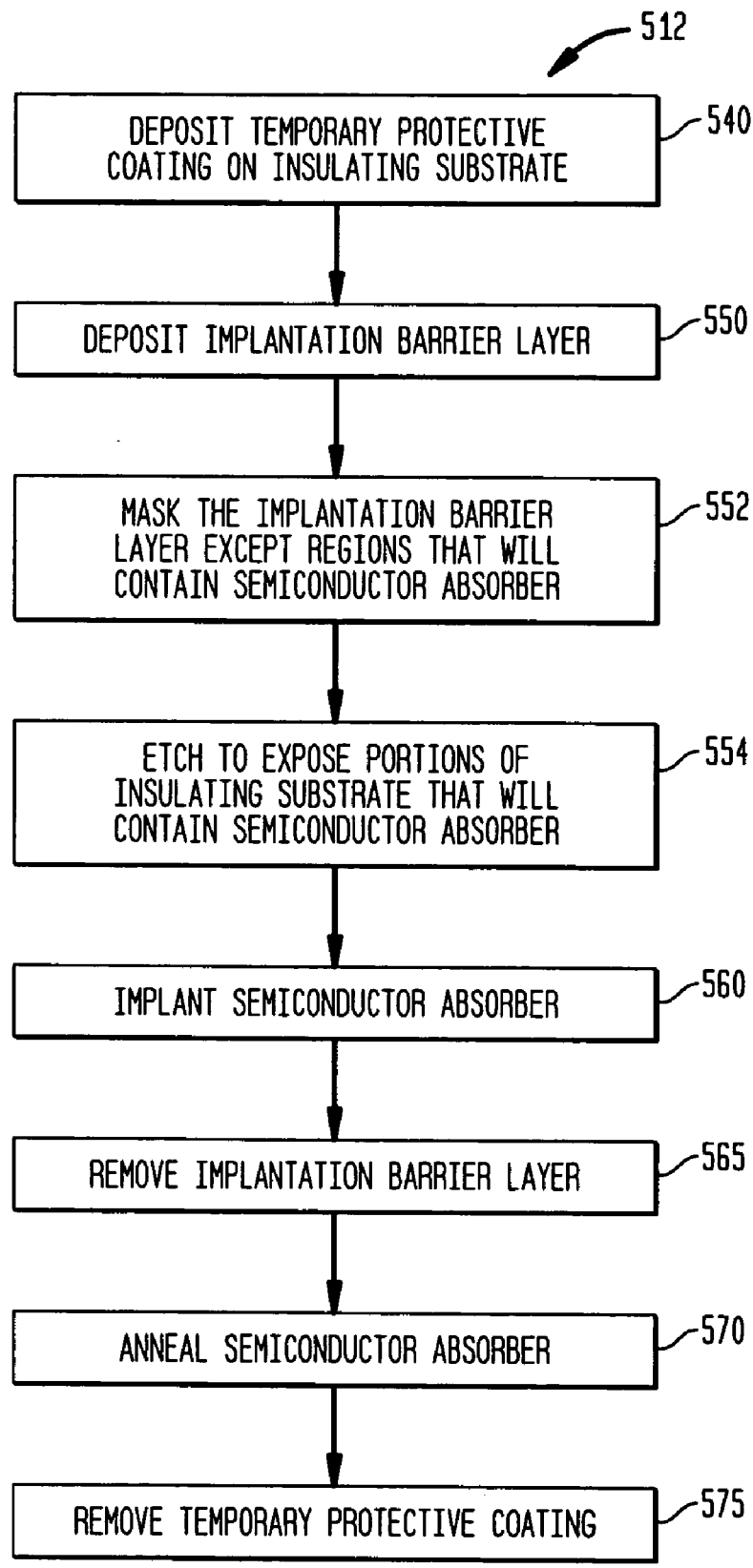

FIG. 8 shows an exemplary modified method for carrying out step 512 in order to prepare an implanted semiconductor absorber. In accordance with FIG. 8, step 540 is carried out in the same manner as discussed above in connection with FIG. 7. Step 545 as shown in FIG. 7 and discussed above is then omitted. Next, step 550 is carried out in the same manner as discussed above in connection with FIG. 7. As a result, the temporary protective coating layer is overlaid with an implantation barrier layer. Step 555 as shown in FIG. 7 and discussed above is then omitted.

Referring to FIG. 8, in step 552 the area of the exemplary portion 100 of a wafer not to be occupied by semiconductor absorber 122 is then masked. This masking step can be carried out, for example, by applying a suitable photoresist layer to the temporary protective coating layer. The photoresist is then selectively exposed to radiation, developed, and the unexposed regions are removed. The resulting developed photoresist constitutes a mask overlying the implantation barrier layer, leaving exposed only those regions of the temporary protective coating layer intended for implantation of the semiconductor absorber. The selected photoresist composition is resistant to an etchant for removal of the unmasked portions of the implantation barrier layer.

In step 554, the exposed regions of the implantation barrier layer are etched to expose the underlying regions of the temporary protective coating layer. This step employs an etchant that is capable of dissolving the implantation barrier layer but to which the mask applied in step 552 is adequately resistant.

Following completion of step 554, steps 560, 565, 570 and 575 are carried out in the same manner as discussed above in connection with FIG. 7. The resulting insulating substrate 132 with an implanted semiconductor absorber 122 is substantially equivalent to that prepared in accordance with the method shown in FIG. 7.

Further modifications to the method steps shown in FIGS. 5–8 and discussed above are also contemplated. For example, preparation of device alignment marks in step 510 can be omitted. Alternatively, step 510 can be carried out, for example, after completion of step 570 or after completion of step 575. A liftoff mask process can be used for forming the device alignment marks. For example, a liftoff mask can be applied to all regions of the insulating substrate 132 except for those intended to include device alignment marks. A device alignment mark layer is then applied over the liftoff mask. Next, the liftoff mask is removed along with overlying portions of the device alignment mark layer, leaving the desired device alignment marks on the insulating substrate 132.

FIGS. 7 and 8 both relate to methods involving fabrication of the semiconductor absorber 122 by ion implantation. Other types of fabrication methods not involving ion implantation are also contemplated. For example, the insulating substrate 132 may be provided with via trenches that are then filled with a doped semiconductor to form the semiconductor absorber 122

FIG. 9 shows an exemplary method 900 for fabricating the exemplary test transistor 105. Fabrication of exemplary test transistor 105 constitutes the second stage in production of the completed devices shown in FIGS. 1–3. Exemplary test transistor 105 is fabricated using conventional equipment, materials and procedures.

The exemplary method 900 begins in step 905 with provision of an insulating substrate 132 having a semiconductor absorber 122. Step 905 can be suitably carried out as described above in connection with FIGS. 7 and 8.

In one exemplary embodiment according to the present invention, exemplary test transistor 105 is a bipolar NPN type DHBT transistor. Although FIG. 9 will be discussed in connection with fabrication of a bipolar NPN type DHBT transistor, it is to be understood that PNP type bipolar transistors, as well as the other types of transistors earlier discussed, can also be fabricated.

Various CVD or epitaxial processes can be used for deposition of layers of semiconductor materials in fabrication of exemplary test transistor 105, as earlier discussed. MOCVD or MOMBE are typically the processes of choice for active device fabrication. FIG. 9 will be discussed in connection with use of an exemplary MOMBE process.

In step 910, a layer of a heavily doped semiconductor for forming exemplary subcollector layer 123 is deposited on insulating substrate 132. The layer of material for forming subcollector 123 is an n type doped semiconductor. In one embodiment according to the present invention, the layer of material for forming subcollector 123 is indium gallium arsenide doped with n type atoms such as, for example, silicon or tin. The layer of indium gallium arsenide for subcollector 123 is doped with n type dopant atoms to a concentration, for example, within a range between about $1\times10^{18}$ and about $1\times10^{20}$ of n type dopant atoms per cubic centimeter ($cm^3$), or, for example, about $1\times10^{19}$ or more n type dopant atoms per $cm^3$. The layer of material for forming subcollector 123 has a thickness sufficient to obtain a sheet resistance of less than about 10 ohms per square. For example, the layer of material for forming subcollector 123 can have a thickness within a range between about 100 nm and about 500 nm.

In step 915, a layer of n-type doped semiconductor for forming exemplary collector 124 is deposited on the layer of material for forming subcollector 123. The semiconductor for collector 124 is, for example, indium phosphide doped with silicon or tin, for example. However, the dopant concentration in the layer of material for forming collector 124 is smaller than that in the layer of material for forming subcollector 123. For example, the layer of material for forming collector 124 is doped with n type dopant atoms to a concentration, for example, within a range between about $1\times10^{16}$ and about $4\times10^{17}$ of n type dopant atoms per $cm^3$. The layer of material for forming collector 124 can have a thickness, for example, within a range between about 100 nm and about 500 nm.

In step 920, a layer of p-type semiconductor for base 125 is deposited on the layer of material for forming collector 124. The semiconductor for base layer 125 is, for example, indium gallium arsenide doped with carbon or beryllium. The layer of material for base layer 125 is doped with p type dopant atoms to a concentration, for example, within a range between about $1\times10^{19}$ and about $1\times10^{20}$ of p type dopant atoms per $cm^3$. The layer for the base 125 can have a thickness, for example, within a range between about 10 nm and about 100 nm, or, for example, about 30 nm. In general, the layer of material for base 125 has a lesser thickness than does the layer of material for collector 124 or than does the layer for emitter 126.

In step 925, a layer of n-type semiconductor for emitter 126 is deposited on the layer for base 125. The semiconductor is, for example, indium phosphide doped with silicon or tin. The layer for the emitter 126 is doped with n type dopant atoms to a concentration, for example, within a range between about $1\times10^{17}$ and about $1\times10^{19}$ of n type dopant atoms per $cm^3$, or, for example, within a range between about $5\times10^{17}$ and about $5\times10^{18}$ of n type dopant atoms per $cm^3$. The layer of material for forming the emitter 126 can have a thickness, for example, within a range between about 40 nm and about 100 nm.

In step 930, a layer of conductive material for the emitter contact 131 is deposited on the layer for the emitter 126. In step 935, the layers of material for the emitter contact 131 and the emitter 126 are etched to form the emitter contact 131 and the emitter 126. In step 940, a layer of conductive material for base contacts 129 and 130 is deposited onto the layer of material for the base 125. In step 945, the layers of material for base contacts 129 and 130, base 125, and collector 124 are etched to form base contacts 129 and 130, base 125, and collector 124. In step 950, a layer of conductive material for collector contacts 127 and 128 is deposited onto the layer for the subcollector 123. In step 955, the layer of material for collector contacts 127 and 128 is etched to form collector contacts 127 and 128. The method 900 can be used to simultaneously fabricate a desired plurality of active devices.

Other types of active devices can also be fabricated on the exemplary insulating substrate 132. Such devices may include, for example, other types of transistors, circuits, integrated circuits, diodes, and memory cells. The processes for fabricating such devices can be integrated in the same manner with the exemplary processes discussed above in connection with FIGS. 5 and 8.

FIG. 10 shows an exemplary method 1000 for fabrication of the dissipative conductor 115 and transistor probe contacts 107, 108, 109 and 110 of exemplary test transistor 105. Fabrication of the dissipative conductor 115 and transistor probe contacts 107, 108, 109 and 110 constitutes the third stage in production of the completed devices shown in FIGS. 1–4.

In step 1010, the exemplary test transistor 105 is covered with a dielectric passivation layer 133. The dielectric passivation layer 133 is an insulating dielectric material that serves to insulate the test transistor 105 from unwanted electrical contacts, to physically protect the delicate transistor from any direct contact, and to provide a stable platform for completing fabrication of the exemplary portion 100 of a wafer. The dielectric passivation layer 133 can be fabricated of, for example, silicon dioxide, silicon nitride, divinylsilane benzocyclobutene (BCB), or siloxene. Siloxene is a methylated Si—O polymer commonly known as spin on glass (SOG).

In step 1015, the dielectric passivation layer 133 is masked, leaving exposed only those regions overlying the semiconductor absorber 122. Step 1015 can be carried out, for example, by applying a photoresist to the dielectric passivation layer 133 that upon development is capable of resisting dissolution by an etchant suitable to dissolve the dielectric passivation layer 133. The regions of the photoresist surrounding those regions overlying the semiconductor absorber 122 are then exposed to photoresist developing radiation. Depending on the composition of the photoresist, the undeveloped portions may need to then be washed away.

In step 1020, a suitable etchant is applied to remove regions of the dielectric passivation layer 133 so as to form trenches that extend to the semiconductor absorber 122. For example, a dry etching process with a carbon tetrachloride and oxygen plasma can be used.

In step 1025, a dissipative conductor layer of a low to medium resistive material is applied over the dielectric passivation layer 133 in order to form the exemplary dissipative conductor 115. The conductivity of the material for forming the dissipative conductor may provide, for example, a sheet resistance within a range between about 10 ohms per square and about 500 ohms per square, or, for example, about 50 ohms per square. For example, a nickel chromium alloy can be used. Other suitable exemplary metals for use in forming the conductive layer of a low to medium resistive material include nickel, chromium, palladium, platinum, and their alloys. The conductivity of elemental gold is too high for forming the dissipative conductor.

In step 1030, the portions of the dissipative conductor layer intended to constitute the dissipative conductor are masked. Step 1030 can be carried out, for example, by applying a photoresist to the dissipative conductor layer that upon development is capable of resisting dissolution by an etchant suitable to dissolve the dissipative conductor layer. The regions of the photoresist to constitute a mask are then exposed to photoresist developing radiation.

In step 1035, the masked dissipative conductor layer is etched to form the dissipative conductor. Suitable etchant compositions for the dissipative conductor compositions listed above include, for example, potassium hydroxide or sodium hydroxide. Alternatively, a plasma etching process can be used.

In step 1040, via holes are formed in the surface of dielectric passivation layer 133 to expose either or both of collector contacts 127 and 128, either or both of base contacts 129 and 130, and emitter contact 131. Only one via hole to the emitter contact 131 is needed, since the test probe contacts 107 and 110 are physically connected to each other. Step 1040 can be carried out, for example, by masking and etching the passivation layer 133 in a similar manner as described above in steps 1015 and 1020.

In step 1045, a metal layer is applied over the dielectric passivation layer 133 for forming precursors for the exemplary test transistor probe contacts 107, 108, 109 and 110 and the exemplary transistor conductors 150, 151, and 152. Upon deposition of this layer, the metal flows into the via holes formed in step 1040, creating the conductors 150, 151, and 152. In addition, a coating layer of the metal is deposited over the dielectric passivation layer 133. Suitable metal compositions for forming these device features have very low resistance. The conductivity of the test probe contacts and transistor conductors may provide, for example, a sheet resistance within a range between about 0.1 ohms per square and about 10 ohms per square, or, for example, about 2 ohms per square. Suitable metals for use in forming the metal layer include, for example, palladium, platinum, gold, titanium, copper, tungsten, and alloys.

In step 1050, the metal layer is masked in regions for formation of exemplary test transistor probe contacts 107, 108, 109 and 110. Step 1050 can be carried out in a manner similar to that used in steps 1015 and 1030, using a suitable photoresist. In one embodiment according to the present invention, the dissipative conductor 115 formed in step 1035 remains protected by the mask formed in step 1030.

In step 1055, the unmasked regions of the metal layer are etched away, forming the exemplary test transistor probe contacts 107, 108, 109 and 110. The exemplary test transistor probe contacts 107, 108, 109 and 110 are in electrical communication with the exemplary test transistor 105 itself through the exemplary transistor conductors 150, 151, and 152 as discussed earlier in connection with FIG. 2.

While the present invention has been disclosed in the context of various aspects of presently preferred embodiments, it will be recognized that the invention may be suitably applied to other environments consistent with the claims which follow. For example, a given semiconductor chip may be provided with any desired combination of active devices and of manufacturing quality control test devices. The shape, size and locations of the conductive isolation frames shown in the figures can be varied to suit the needs of a particular semiconductor chip design. The method steps shown in FIGS. 5–10, as already pointed out, can be modified in accordance with the spirit of the present invention. Active device fabrication procedures are extremely complex, and the method steps according to the present invention can be adapted consistent with efficient execution of such active device fabrications.

The materials discussed above for fabrication of wafers are exemplary and non limiting. Other suitable materials can be used. For example, although exemplary embodiments according to the present invention have been discussed in connection with use of indium phosphide and indium gallium arsenide, such semiconductors can be substituted by each other and replaced by other semiconductors. Other suitable semiconductors include, for example, gallium arsenide, aluminum gallium arsenide, indium gallium phosphide, indium gallium arsenide phosphide, indium aluminum gallium arsenide, gallium nitride, indium nitride, aluminum nitride, aluminum gallium nitride, indium aluminum gallium nitride, gallium antimonide, indium antimonide, aluminum antimonide, aluminum gallium antimonide, indium aluminum gallium antimonide, indium arsenic antimonide, gallium aluminum antimonide, indium gallium antimonide, and gallium arsenic antimonide. Semiconductor devices can also be fabricated on wafers constituted by a highly insulating dielectric substrate material such as silicon dioxide, polytetrafluoroethylene or other organic polymer.

We claim:

1. A microelectronic apparatus having protection against high frequency electromagnetic radiation, comprising:
a planar insulating substrate;
an active semiconductor electronic device located over a first region of said insulating substrate;
a doped semiconductor absorber located in a second region of said insulating substrate substantially surrounding said first region;
a second active semiconductor electronic device located over a third region of said insulating substrate, said third region being substantially separated from said first region by said second region; and
a dissipative conductor overlaying and adjacent to said doped semiconductor absorber;
wherein said semiconductor absorber and dissipative conductor are configured to dissipate electromagnetic radiation having a center frequency within a range of between about 1 gigahertz and about 1,000 gigahertz.

2. The microelectronic apparatus of claim 1, in which said doped semiconductor absorber fills a trench located in said second region.

3. The microelectronic apparatus of claim 1, in which said doped semiconductor absorber comprises an n type semiconductor dopant.

4. The microelectronic apparatus of claim 1, further comprising:
a dielectric passivation layer having a first surface overlaying said insulating substrate and having a second surface;
said dielectric passivation layer having a thickness extending between said first and second surfaces;
said dissipative conductor extending into said dielectric passivation layer.

5. The microelectronic apparatus of claim 1, in which the dissipative conductor includes a metal selected from the group consisting of nickel, chromium, palladium, platinum, and alloys thereof.

6. The microelectronic apparatus of claim 1, in which said first and second active semiconductor electronic devices are selected from the group consisting of transistors, circuits, integrated circuits, diodes, and memory cells.

7. The microelectronic apparatus of claim 4, in which said dissipative conductor fills a trench located in said dielectric passivation layer.

8. The microelectronic apparatus of claim 4, in which said dissipative conductor extends from said first surface toward said second surface over at least about half of said thickness.

9. The microelectronic apparatus of claim 4, further comprising:
metallic test probe contacts located at said second surface, said metallic test probe contacts making electrical connections with said active semiconductor electronic device.

10. The microelectronic apparatus of claim 8, in which said dissipative conductor extends from said first surface to said second surface.

11. A method of making a microelectronic apparatus having protection against high frequency electromagnetic radiation, comprising the steps of:
providing a planar insulating substrate;
forming an active semiconductor electronic device located over a first region of said insulating substrate;
forming a doped semiconductor absorber located in a second region of said insulating substrate substantially surrounding said first region;
forming a second active semiconductor electronic device located over a third region of said insulating substrate, said third region being substantially separated from said first region by said second region; and
forming a dissipative conductor overlaying and adjacent to said doped semiconductor absorber;
wherein said semiconductor absorber and dissipative conductor are configured to dissipate electromagnetic radiation having a center frequency within a range of between about 1 gigahertz and about 1,000 gigahertz.

12. The method of claim 11, in which said doped semiconductor absorber is formed by the step of implanting dopant ions in a trench located in said second region.

13. The method of claim 11, further comprising the step of:
forming a dielectric passivation layer having a first surface overlaying said insulating substrate and having a second surface;
said dielectric passivation layer having a thickness extending between said first and second surfaces;
said dissipative conductor extending into said dielectric passivation layer.

14. The method of claim 13, in which said dissipative conductor is formed by the steps of:
providing a trench located in said dielectric passivation layer; and
filling a dissipative conductor into said trench.

15. The method of claim 13, further comprising the step of:
forming metallic test probe contacts located at said second surface, said metallic test probe contacts making electrical connections with said active semiconductor electronic device.

16. The microelectronic apparatus of claim 1, in which the dissipative conductor has a sheet resistance within a range of between about 10 ohms per square and about 500 ohms per square.

17. The method of claim 11, comprising the step of forming a dissipative conductor having a sheet resistance within a range of between about 10 ohms per square and about 500 ohms per square.

* * * * *